United States Patent
Huish et al.

(10) Patent No.: US 8,427,158 B2
(45) Date of Patent: Apr. 23, 2013

(54) ANTENNA ASSEMBLY

(75) Inventors: David William Huish, Winchester (GB); John Hunt, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 462 days.

(21) Appl. No.: 12/753,138

(22) Filed: Apr. 2, 2010

(65) Prior Publication Data

US 2010/0253350 A1   Oct. 7, 2010

(30) Foreign Application Priority Data

Apr. 3, 2009  (GB) ................................. 0905768.8
Sep. 8, 2009  (GB) ................................. 0915650.6

(51) Int. Cl.
*G01V 3/00* (2006.01)

(52) U.S. Cl.
USPC ....................................................... 324/318

(58) Field of Classification Search ........... 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 4,387,470 A | 6/1983 | Maurer et al. | |
| 5,245,288 A | 9/1993 | Leussler | |
| 5,384,536 A | 1/1995 | Murakami et al. | |
| 5,990,681 A * | 11/1999 | Richard et al. | 324/318 |
| 6,661,229 B2 * | 12/2003 | Weyers et al. | 324/318 |
| 6,781,378 B2 * | 8/2004 | Eberler et al. | 324/318 |
| 6,906,520 B2 | 6/2005 | Heid et al. | |
| 6,992,486 B2 * | 1/2006 | Srinivasan | 324/318 |
| 7,012,431 B2 * | 3/2006 | Nistler | 324/318 |
| 7,123,009 B1 | 10/2006 | Scott | |
| 7,123,090 B2 | 10/2006 | Ratzel | |
| 7,180,291 B2 * | 2/2007 | Chmielewski et al. | 324/318 |
| 7,221,162 B2 * | 5/2007 | Feiweier et al. | 324/318 |
| 7,292,038 B2 * | 11/2007 | Doty | 324/318 |
| 7,323,876 B2 | 1/2008 | Den Boef | |
| 7,417,433 B2 | 8/2008 | Heid et al. | |
| 7,501,826 B2 * | 3/2009 | Eberler et al. | 324/322 |
| 7,589,530 B2 * | 9/2009 | Habara et al. | 324/318 |
| 7,622,928 B2 | 11/2009 | Gauss et al. | |
| 7,663,370 B2 * | 2/2010 | Kroeckel | 324/322 |
| 7,701,220 B2 | 4/2010 | Ehnholm | |

(Continued)

FOREIGN PATENT DOCUMENTS

| | | |
|---|---|---|
| DE | 103 04 861 | 8/2004 |
| GB | 1132545 | 1/1967 |

OTHER PUBLICATIONS

U.S. Appl. No. 12/874,706, filed Sep. 2, 2010.
U.S. Appl. No. 12/726,567, filed Mar. 18, 2010.
U.S. Appl. No. 12/753,159, filed Apr. 2, 2010.

(Continued)

*Primary Examiner* — Dixomara Vargas
(74) *Attorney, Agent, or Firm* — Schiff Hardin LLP (57) ABSTRACT

A wireless magnetic resonance imaging scanner antenna assembly has a radio frequency antenna array having a number of RF antenna rungs, a microwave antenna array having a number of microwave antenna elements, and a number of antenna feeds. The rungs and elements are grouped together in feed subsets, each subset having at least one feed rung, one non-feed rung and associated microwave antenna elements. Signal transfers between a feed rung and a non-feed rung of a subset are made at a point on the feed rung, within a region of minimum potential.

11 Claims, 7 Drawing Sheets

U.S. PATENT DOCUMENTS

| | | | |
|---|---|---|---|
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 7,986,142 B2 * | 7/2011 | Eberler et al. | 324/318 |
| 7,990,146 B2 * | 8/2011 | Lazar et al. | 324/318 |
| 8,049,504 B2 * | 11/2011 | Findeklee | 324/322 |
| 8,089,280 B2 * | 1/2012 | Soutome et al. | 324/318 |
| 8,134,367 B2 * | 3/2012 | Miyauchi et al. | 324/318 |
| 8,170,643 B2 * | 5/2012 | Turner et al. | 600/411 |
| 2003/0206019 A1 | 11/2003 | Boskamp | |
| 2007/0013376 A1 | 1/2007 | Heid et al. | |
| 2007/0176601 A1 | 8/2007 | Adachi | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |
| 2008/0246477 A1 | 10/2008 | Nakabayashi | |
| 2009/0286478 A1 | 11/2009 | Biber et al. | |
| 2010/0253346 A1 | 10/2010 | Hulbert | |

OTHER PUBLICATIONS

U.S. Appl. No. 12/753,132, filed Apr. 2, 2010.
U.S. Appl. No. 12/753,150, filed Apr. 2, 2010.
U.S. Appl. No. 12/753,134, filed Apr. 2, 2010.
U.S. Appl. No. 12/753,148, filed Apr. 2, 2010.
"Behavioral Modeling and Simulation of a Parametric Power Amplifier," Gray et al., IMS (2009) pp. 1373-1376.

* cited by examiner

ANTENNA ASSEMBLY

BACKGROUND OF THE INVENTION

1. Field of the Invention

The present invention relates to a wireless magnetic resonance imaging (MRI) scanner antenna assembly and in particular to an arrangement of microwave dipole antennas of a magnetic resonance imaging (MRI) birdcage antenna using an electrical screen as a reflector or using rungs as reflectors.

2. Description of the Prior Art

MRI scanners use a combination of a strong constant magnetic field (B0) from a superconducting magnet which is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically $\lambda/8$) intervals. These add cost and inconvenience to the structure. The solution to this is to provide a wireless system comprising wireless local coils and a microwave antenna array on the scanner bore to receive amplified upconverted signals from the local coils. However, the microwave antenna array needs transmission line feeds which minimize loading of the antenna generating the B1 field.

SUMMARY OF THE INVENTION

In accordance with the present invention, a wireless magnetic resonance imaging scanner antenna assembly has a radio frequency (RF) antenna array having a number of RF antenna rungs, a microwave antenna array having a number of microwave antenna elements; and a number of antenna feeds. The rungs and elements are grouped together in feed subsets, with each subset including at least one feed rung, one non-feed rung and associated microwave antenna elements. Signal transfers between a feed rung and a non-feed rung of a subset are made at a point on the feed rung, within a region of minimum potential.

The assembly enables a wireless solution without undue loading of the rotating field antenna.

Preferably, a distribution ring is mounted within the region of minimum potential.

Preferably, the region of minimum potential is substantially at the mid-point of the rung in the z direction of the bore tube.

Alternatively, the region of minimum potential is at one end of the antenna rung.

Preferably, the RF antenna has an even number of antenna rungs.

Preferably, each subset includes 0.125 or greater the number of rungs in the RF antenna array.

Preferably, each subset includes 0.125 or greater the number of antenna elements in the microwave antenna array.

Preferably, the number of feed rungs in the assembly includes 0.125 of the total number of rungs in the RF antenna array.

Preferably, the antenna rungs are printed on an outer surface of a bore tube spaced at equal intervals around the bore tube.

The assembly may be one in which the antenna rungs act as reflectors for the antenna elements. However, in the case where the screen acts as reflector, preferably, the antenna elements are mounted between adjacent rungs.

Preferably, the region of minimum potential is determined from the breakdown voltage of air and the distance between pads of capacitors required to maintain a good microwave path with less than 0.5 dB insertion loss.

Preferably, signal transfer between adjacent rungs is by means of capacitive coupling.

DESCRIPTION OF THE PREFERRED EMBODIMENTS

The wireless concept is based on upconversion of the RF (Larmor) frequency signals to microwave frequencies and transmission from local coils located in the patient mat to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from the patient antennas to be resolved. Ideally, the wireless solution substantially satisfies the requirements of the existing wired system, maintaining in particular the low noise figure and the dynamic range.

An example of a wireless MRI scanner bore tube assembly which may include an antenna assembly according to the present invention is described in co-pending patent application no. 0903729.2, corresponding to U.S. Ser. No. 12/613,004 filed Nov. 5, 2009. The bore tube assembly has an RF antenna, a microwave antenna array and an electrical screen. The RF antenna has a series of RF antenna elements, each having a rung, wherein the rungs are spaced at intervals of substantially half of the wavelength of the frequency of operation of the microwave antenna array. The microwave antenna array has a series of microwave antenna elements interleaved between the rungs and the screen acts as a reflector to reflect signals from the microwave antenna elements toward the center of the bore tube. Alternatively, the antenna elements are positioned such that the rungs can be used to reflect signals from the microwave antenna elements towards the center of the bore tube.

Figure 1:
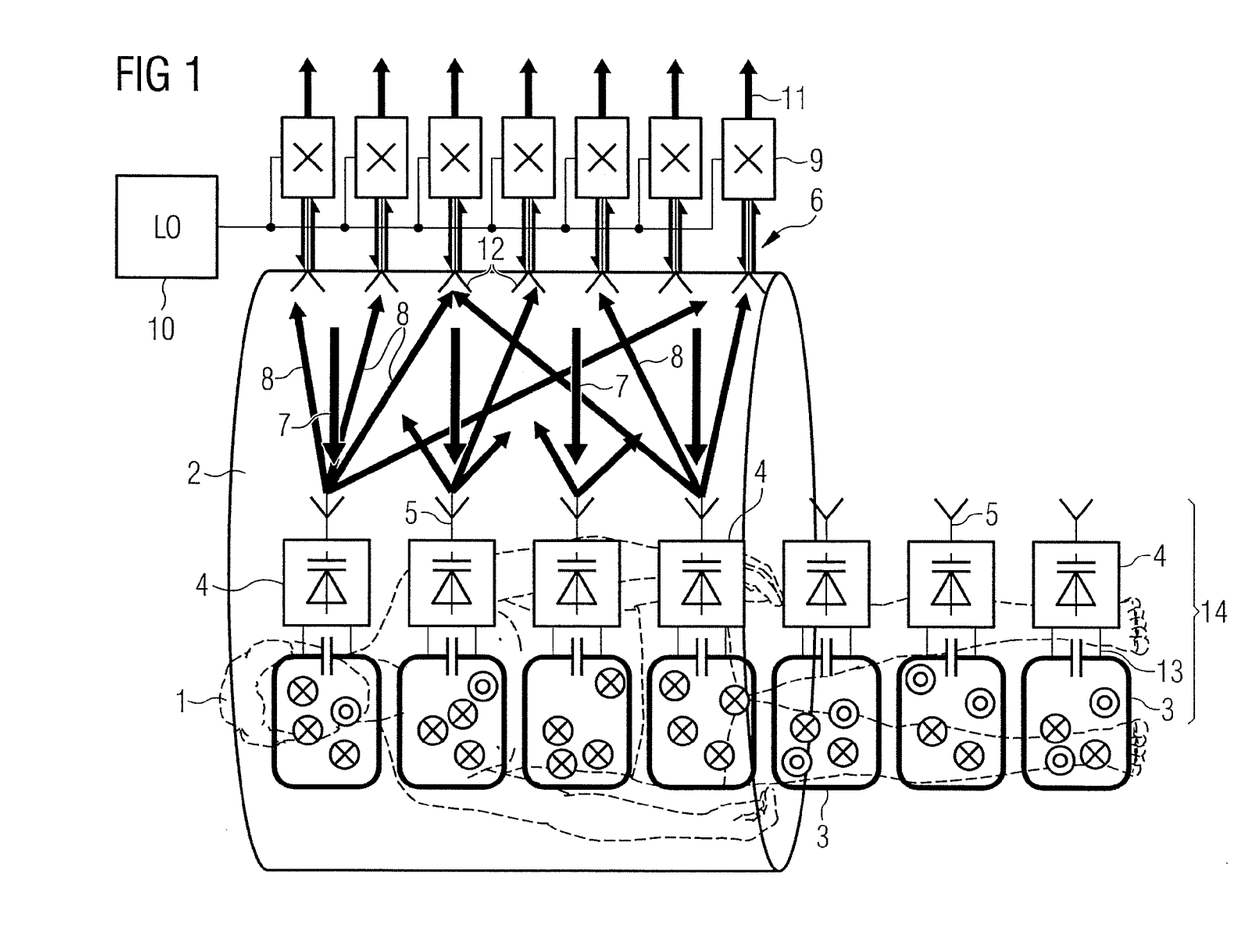
FIG. 1 illustrates a wireless MRI system incorporating a bore tube assembly in which an antenna assembly according to the present invention may be used.

An example of an MRI system using a MIMO microwave link, suitable for using a bore tube assembly of this type will now be described. However, other architectures are possible. FIG. 1 shows a patient 1 within an MRI scanner bore tube 2. A mat covers those parts of the patient for imaging and embedded in the mat are a plurality of local coils 3. Associated with each local coil 3 is an upconverter 4 and microwave antenna 5. Transceivers 9 connected to an array 6 of antennas 12 are integrated into the scanner bore 2. The frequency upconverter 4 for each patient mat coil 3 produces signals for transmission to the array of transceivers in the scanner bore 2. A signal generator 10 generates a local oscillator (LO) signal at 2.44 GHz, or other chosen microwave frequency, which feeds the transceivers connected to the antenna array 6 to illuminate the patient coil electronics 14 with a signal 7 at the local oscillator frequency. The same LO signal in the transceivers converts the microwave signals 8, received from the patient coils 3 at the LO frequency ±63 MHz, back to the original magnetic resonance (MR) frequency of 63 MHz for input 11 to MR receivers in an image processing system (not shown). The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6. In one embodiment, an arrangement of microwave dipole antennas is fabricated on the same printed circuit board as a magnetic resonance imaging (MRI) birdcage antenna and located between the rungs. The radio frequency (RF) screen, located on the inner surface of the gradient coil acts as a reflector for the microwave antennas In order for the wireless system to operate with minimal or no degradation in received signal to noise ratio the array 6 of microwave antennas 12 around the bore 2 must have element center to element center spacing in both directions, around and along the bore, of the order of half the wavelength of the operational microwave frequency. Patient coil spacing influences the choice of microwave link frequency but in general, any microwave frequency may be chosen providing that it is high enough to provide the spatial resolution and low enough that the number of required bore antenna elements and associated electronics is practical. Operation at 2.44 GHz gives an antenna spacing of about 6 cm.

As described earlier, MRI scanners necessarily incorporate an RF antenna that generates the $B_1$ field at the Larmor frequency, which is dependent upon the B0 field strength, so is 63.6 MHz for a typical 1.5 Tesla B0 magnetic field, or 123 MHz for a 3 T system. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

Figure 2:
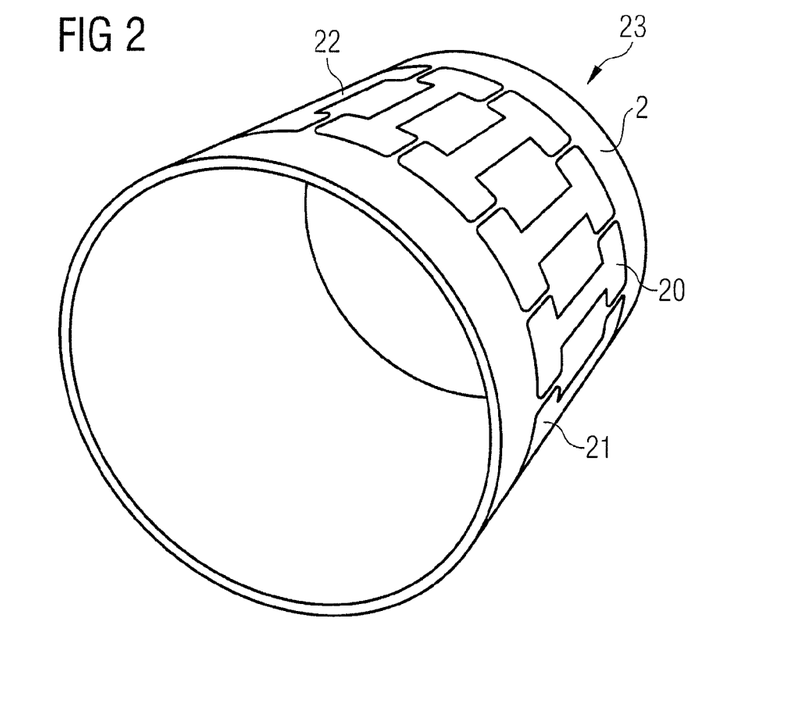
FIG. 2 illustrates a schematic outline of a simplified conventional birdcage type RF antenna.

Commonly the construction of the $B_1$ field antenna 24, also known as the 'body coil', takes the form of a 'birdcage' with two separated rings 20, 21 printed around the bore 2 and connected by a number of rungs 22 regularly spaced around the bore, as shown in FIG. 2. Each element 23 of the antenna is formed of a rung and a part of each ring. The width and spacing of the rungs around the circumference of the bore are chosen to maintain half wavelength spacing of the microwave elements and provide sufficient current handling capability for the body coil. The minimum gap between end ring segments that form the end rings is determined by the RF voltage present between adjacent segments during the excitation phases of a scan. The length of the rungs and the dimensions of the end ring segments are dependent upon the volume that needs to be imaged and the constraints imposed by specific absorption rate (SAR) limits. Capacitors and diodes (not shown) are incorporated in the design of the body coil at appropriate positions for tuning and switching purposes. A screen 34 is printed on the inside of the gradient coil (not shown) to minimize undesirable egress of $B_1$ field energy outside the bore imaging region. A gap of 1 to 2 cm of air or glass reinforced plastic (GRP) between the screen and the body coil allows a flux return path for the magnetic fields generated by the body coil rung currents.

The arrangement of microwave antennas aims to satisfy a number of requirements. These include high efficiency, i.e. that gain is directed towards the center of the bore; a consistently good impedance match over a useful range of angles of incidence; a negligible effect on $B_1$ field uniformity and strength; practical implementation of feeds to the microwave antennas and the creation of a microwave absorptive surface achieved by the half wavelength spacing of the elements in the array.

Figure 3:
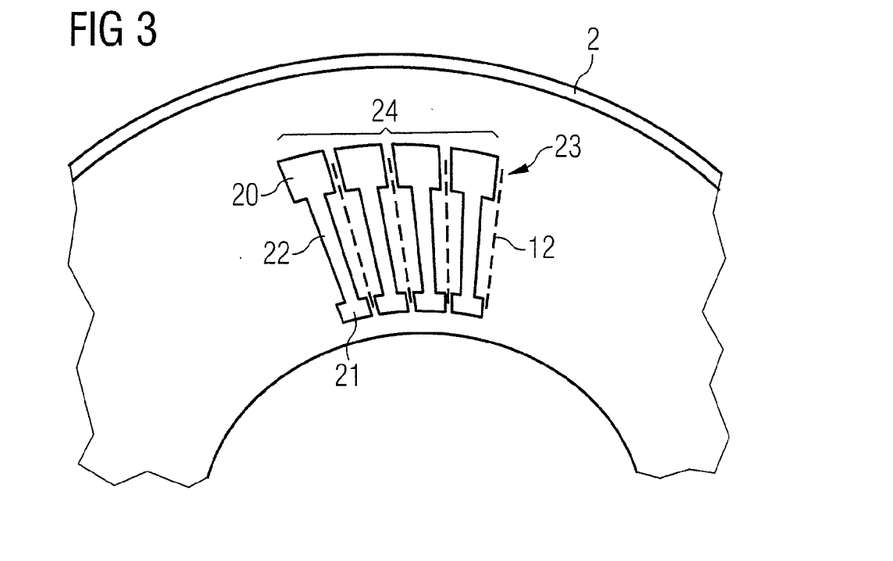
FIG. 3 illustrates the integration of microwave antenna elements into a birdcage RF antenna with the bore tube assembly of FIG. 1.

The number of body coil rungs around the bore is arranged, such that the separation between adjacent rungs is nominally equal to $\lambda/2$ at the LO frequency, which for the example given above means a separation of about 6 cm. Dipole antennas, which may take the form of "standard" dipole antennas, folded dipole antennas, inductively loaded or capacitively loaded dipole antennas, are located in between and coplanar with the rungs and orientated as shown in FIG. 3. In a practical implementation, the birdcage rungs and antenna elements cover the entire circumference of the bore tube 2, but for clarity, only a subset of antenna elements are shown in the figures.

Figure 4A:
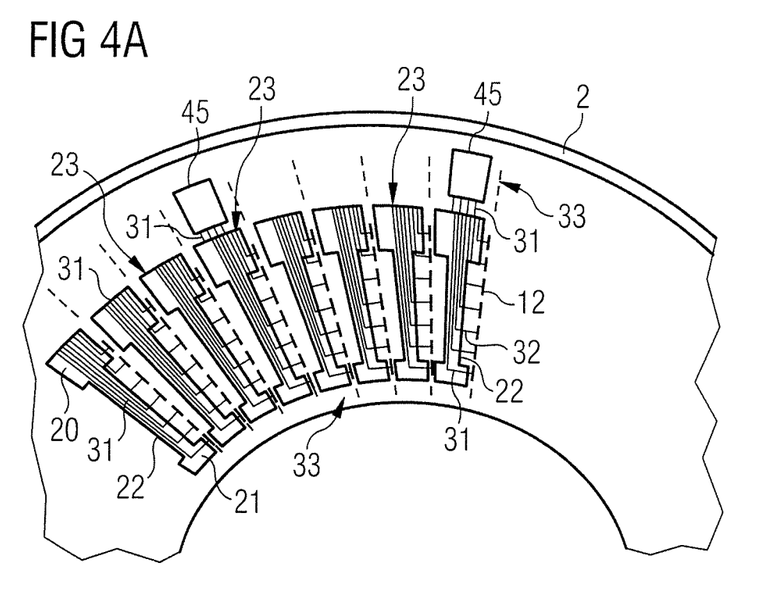
FIG. 4A illustrates an example of how feed lines to the microwave antenna elements are provided and an antenna feed according to the present invention, integrated into the bore tube assembly of FIG. 1.

The bore tube, shown in FIG. 3 comprises a support tube 2, with bird cage antenna elements 23 provided on the support tube and microwave dipole antenna elements 12 in parallel in gaps between the bird cage antenna elements 23. One method of construction of the microwave array 6 is to print both the body coil 24 and microwave dipole array 6 on a thin flexible substrate material 35, which is wrapped around the outside of the mechanically strong support tube 2 having a similar form to support tubes that are currently in use. The printed antenna rungs on the outer surface of the bore tube are spaced at equal intervals around the bore tube. In this example, the antenna elements are mounted between adjacent rungs. FIG. 4A illustrates an example in which an antenna feed 45 according to the present invention, is provided at a first rung 22 within a set of rungs, but not for all rungs.

Figure 4B:
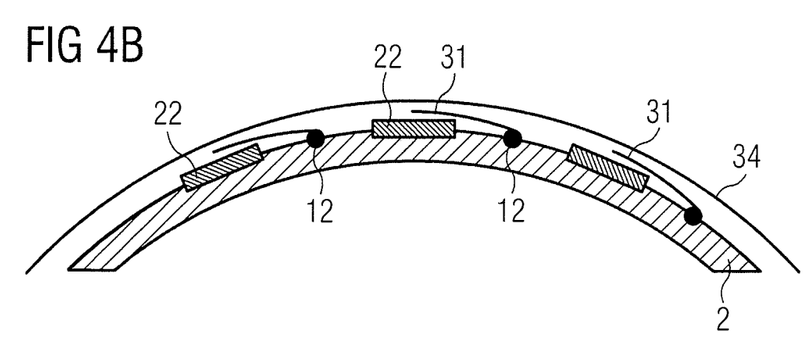
FIG. 4B is a cross-section showing the relative arrangements of the RF antenna elements and microwave antenna elements using a screen as a reflector in the bore tube assembly of FIG. 1.

As shown in FIG. 4B, an RF screen 34 is provided outside the rungs 22 and dipoles 12. This screen then also functions as a reflector for the dipole antenna elements, augmenting their gain toward the bore center whilst reducing wasteful radiation of energy away from the bore. The bore tube is constructed with the screen layer 34, typically copper, positioned inside the gradient coils and outside the support tube 2, which is typically a plastic tube. The integration of the microwave antenna in the bore tube is arranged to minimize adverse interaction between the two.

Figure 5A:
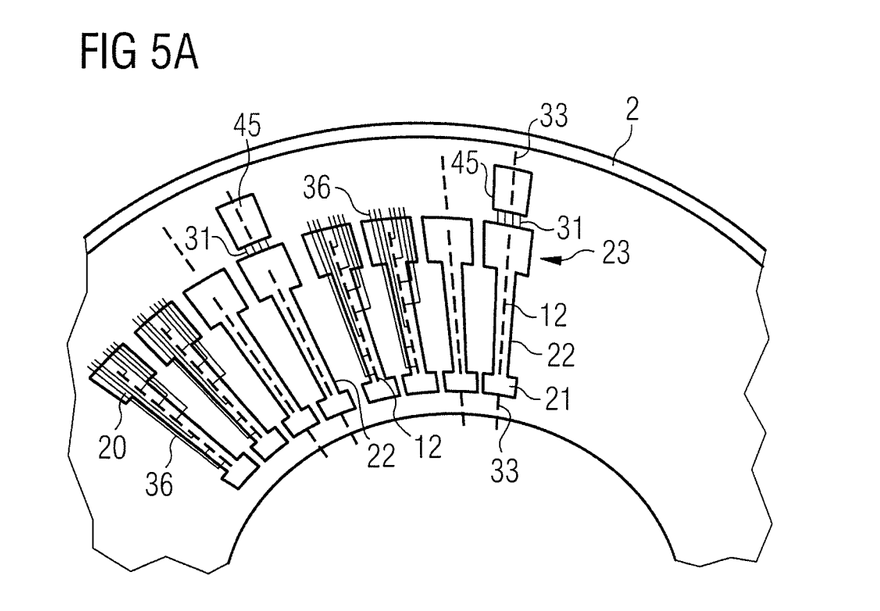
FIG. 5A illustrates another example of how feed lines to the microwave antenna elements using rungs as reflectors are provided and an antenna feed according to the present invention, integrated into the bore tube assembly of FIG. 1.

In such a construction, the antennas may be fed by microstrip or stripline feed lines, where the rungs of the body coil form the ground plane for the feeds. The example shown in FIG. 4A is of microstrip feed lines 31, running along the long axis of the RF antenna elements 23, connected to the microwave antennas 12 using baluns 32. The other end of each feedline is connected to suitable filters, or "traps", (not shown) that are designed to block the transmission of signals at the Larmor frequency, but allow transmission of the microwave signals to and from the bore electronics. However, for the present invention, FIGS. 4A and 5A illustrate examples of how the antenna feed of the present invention is incorporated into the bore assembly. The antenna feed 45 is positioned at one end of a feed rung 22 of the birdcage antenna and the transmission lines 31 pass signals from the antenna feed 45 to the microwave antenna elements 12. In this example, only one in four of the antenna rungs 22 arrayed around the bore tube have a direct connection to the antenna feed. Elements on any other rung receive signals routed via the transmission lines on the feed rung and across to the transmission lines on those elements.

Additional microwave antenna elements 33 may be located beyond the ends of the body coil, but also printed on the same substrate material. These elements will radiate with the same polarization as the dipoles to provide the required microwave coverage for both LO illumination and microwave reception of the upconverted signals. These elements may take the form of dipoles or patch antennas.

The microwave feedline 31 and array structure 6 integrated with the body coil 24 has a number of advantages making it suitable for the wireless application. The RF screen 34 acts as a reflector directing energy towards the center of the bore tube 2. The structure can be fabricated using standard printed circuit board manufacturing methods, so that the structure benefits from thin metallic layers to minimize the introduction of eddy currents caused by the switching of the gradient coils; the structure is mechanically and hence electrically repeatable and so provides a good impedance match at the microwave antenna ports; the structure fits into the existing spatial constraints with no impact on bore diameter; and a single process is used to deposit the body coil 14 and the microwave array 6 on same substrate 35. In an example of using a microstrip feed arrangement, the dipoles 12 and antenna elements 23 may be printed onto one side of a thin pcb, with the feed 31 printed onto the other side with the pcb then wrapped around the outside of the support tube 30. The feed structure of the present invention makes use of the copper rungs in the existing designs as ground plane and therefore has minimal impact on $B_1$ field uniformity and strength. Low noise amplifiers, or similar electronics may also be mounted on the thin PCB within the active bore region, also using the body coil rung 22 as the ground plane. The dc power for these components may be fed via trapped dc feedlines or connected to the zero RF potential points on the body coil, or fed via bias tees and the microwave lines.

In an alternative implementation, rather than providing the screen, as in FIGS. 4A and 4B, the rungs 22 of the bird cage antenna elements 23 act as reflectors. One method of construction of the integrated system implements the birdcage antenna and the microwave array on two separate printed flexible printed circuit boards (PCBs.) The flexible bird cage 23 is etched from copper on a flexible PCB which is then wrapped around and bonded to the outside of a mechanically strong support tube 30, typically plastic, having a similar form to support tubes that are currently in use. The microwave dipole array 6 is etched from copper on a second flexible PCB which is then bonded to the inside of the bore tube 2. The two PCBs are designed such that the angular pitch of the strips of microwave radiating elements around the axis of the bore is the same as that of the rungs 22. The two flexible PCBs are installed on the support tube such that the microwave antenna array strips are in angular alignment with the rungs 22 of the birdcage antenna so as to allow the rungs 22 to function as reflectors for the microwave dipole antenna elements, thereby augmenting the gain of the microwave antennas towards the bore center. The bore tube is constructed with the screen layer 34, typically copper, positioned inside the gradient coils and outside the support tube 30. The integration of the microwave antenna in the bore tube is arranged to minimize adverse interaction between the two.

Figure 5B:
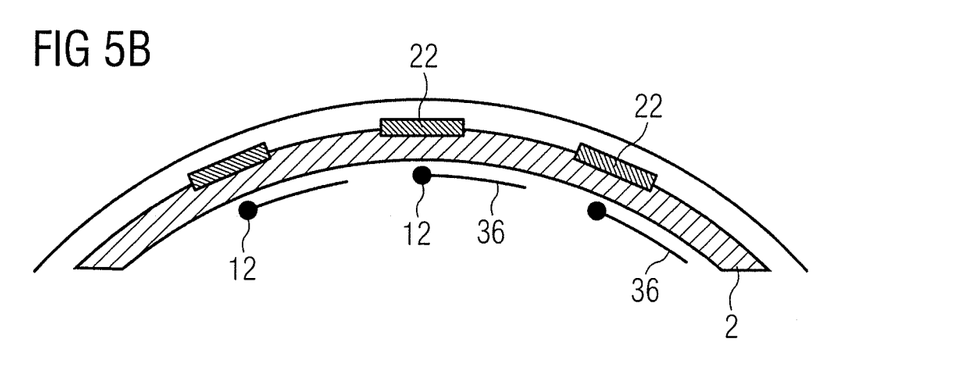
FIG. 5B is a cross-section showing the relative arrangements of the RF antenna elements and microwave antenna elements using rungs as a reflector in the bore tube assembly of FIG. 1.

In such a construction, the antennas may be fed with a differential transmission line structure 36, for example "parallel plate" type lines. There is a differential feed 36 shown in FIGS. 5a and 5b to each dipole end 12. The ends of the transmission lines not connected to antennas are connected to the antenna feed of the present invention, which blocks the transmission of signals at the Larmor frequency, but allows the transmission of the microwave signals to and from the bore electronics. The dielectric constant and thickness of the bore tube 2 provides an electrical separation between the microwave antenna element 12 and body coil rung 22 that allows the rung to act as a reflector, augmenting the gain of the microwave antennas towards the bore center. The structure can be fabricated using standard printed circuit board manufacturing methods. Benefits of this implementation in thin printed copper include minimization of induced eddy currents caused by the switching of the gradient coils and a mechanically, and hence electrically, repeatable structure that provides a good impedance match and low physical space requirement.

Figure 6:
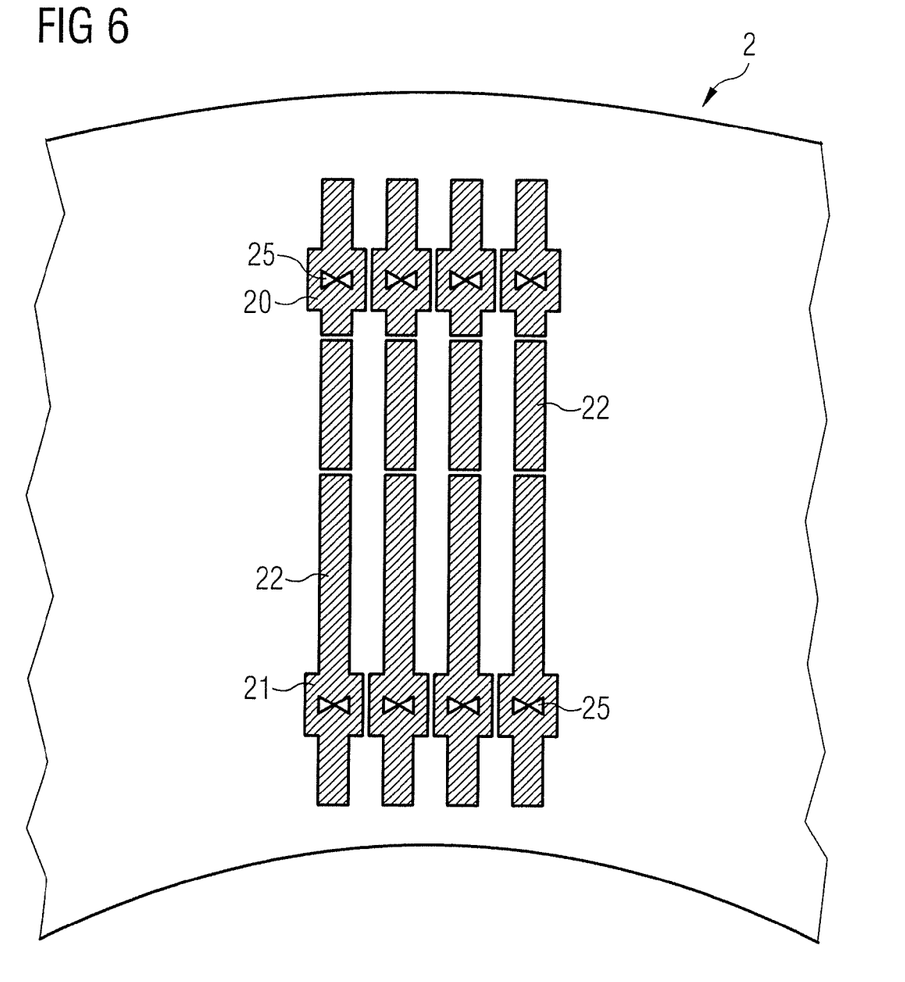
FIG. 6 shows an embodiment of the bore tube assembly of FIG. 1, in which slot antenna elements are provided in end rings.

The structure also lends itself to the introduction of slot antennas 25 in the end rings 20, 21 if space precludes the use of dipoles 12 in this region. This is illustrated in FIG. 6. Such slot antennas are orientated circumferentially to maintain the E-field polarization along the axis of the bore in alignment with the dipoles. Such slot antennas may be aligned parallel with the dominant current flow direction in the end rings 20, 21 and can thereby minimize disruption of the high RF excitation currents. The aggregate antenna structure provides a microwave absorptive surface with the chosen element spacing and feedpoint leading to realizable feedline impedances. Any microwave antennas that do not need to be fed may be terminated with resistive loads to maintain the absorptive properties of the array Co-pending patent application 2009P05904GB01, corresponding to U.S. application with Ser. No. 12/753,148 filed simultaneously herewith, addresses the need to provide transmission line feeds from one or both ends of the bore in a way that minimizes loading for the birdcage antenna at the Larmor frequency and that maintains circumferential symmetry of the loading that does ensue. The co-pending application provides a multiple feed bazooka arrangement, whereby tracks that pass from outside the birdcage antenna are grouped together such that the tracks that connect either directly or via splitters to antennas that lie between a number of birdcage antenna rungs, all pass initially along just one birdcage rung. Hereinafter we refer to this initial birdcage rung that connects to the multiple feed bazooka arrangement, as the initial feed rung. The precise position for connection is not limited, provided that the combination of traps can provide the required rotational symmetry for the feed points to the body coil, which can be fed in multiple locations as long as the feeds are appropriately phased.

Figure 7:
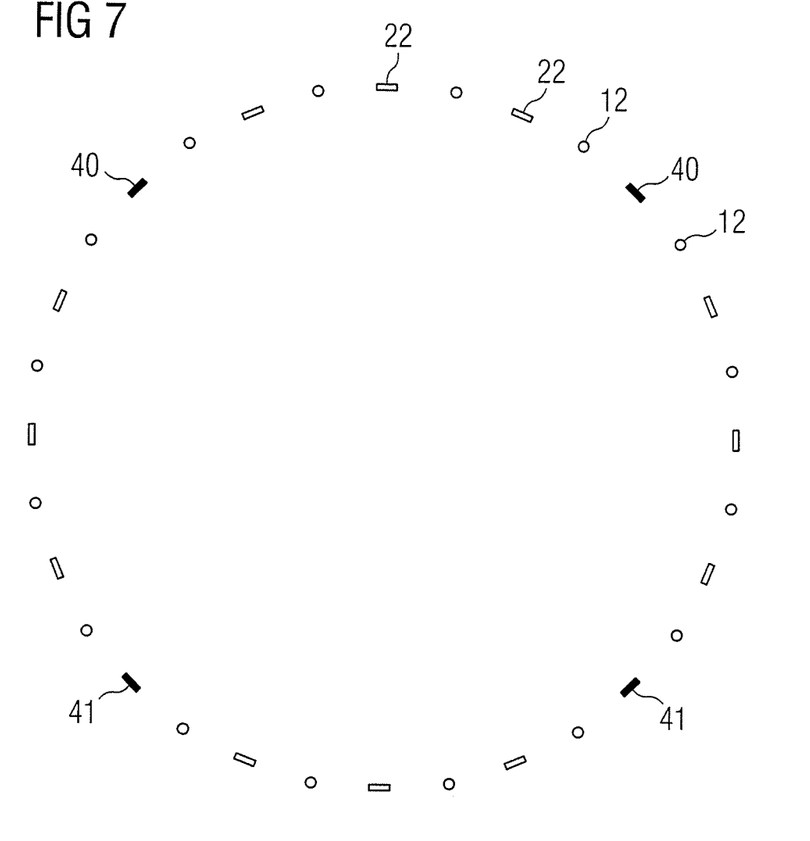
FIG. 7 illustrates components of an example of an antenna assembly according to the present invention.

Thus, a problem arises of arranging for the microstrip feed lines, or tracks 31 that pass along the initial feed rung to reach antennas that lie between pairs of birdcage antenna rungs and in some cases where neither of the birdcage antenna rungs has a feed. This problem is illustrated in FIG. 7. The example of FIG. 7 is a cross section through an antenna assembly showing ends of the body coil rungs 22 between which are microwave antenna elements, or dipoles 12. Only a subset 40, 41 of the rungs 22 can be connected to antenna feeds. The feed rungs 40, 41 are provided with antenna feeds 45 to feed signals into the body coil field antenna and the microwave dipoles 12 respectively. The body coil may have an even number of antenna rungs and a feed subset may comprise 0.125 or greater the number of rungs in the RF antenna array; 0.125 or greater the number of antenna elements in the microwave antenna array; and the number of feed rungs in the arrangement may comprises 0.125 of the total number of rungs in the RF antenna array.

An example embodiment is a 32 rung body coil. Microwave feeds 45 for the coil can only be applied at a limited number of positions, e.g. up to a quarter of the number of rungs can take a feed. Any more than this cause undue loading on the body coil itself. There needs to be a way of transferring the signal from a rung 40, 41 with a feed to the rungs 22 without feeds, so that all of the microwave elements 12 receive their signals. It is desirable that this signal transfer takes place at as low a potential as possible. Typically, the potential along a rung can vary significantly and at its highest may be of the order of kilovolts, whereas at a minimum, it may be zero. The position of minimum voltage depends upon the implementation, and is typically either at one end of the rung, or at the mid-point of the rung, substantially along the z axis of the bore tube. The region of minimum potential is determined from the breakdown voltage of air and the distance between the pads of the capacitors required to maintain a good microwave path with less than 0.5 dB insertion loss.

Conventional MRI scanner birdcage antennas need to be switched into a high impedance mode following the transmission of the excitation pulse in order to avoid absorbing the signals generated by the patient. Typically this is achieved by introducing PIN diode switches into each of the birdcage antenna rungs, somewhere near to the longitudinal center of the birdcage antenna. These switches need to be supplied with forward bias DC current at the times when they need to be in the 'ON' state and need to be reverse biased to avoid conduction when they need to be in the 'OFF' state. A typical arrangement for satisfying the required DC switching conditions is to introduce a distribution ring around the center, or near to the center, longitudinally, of the bore. This ring carries the DC bias voltage to the diodes. Where this coincides with the point of minimum potential, microstrip feeds in these locations can be used to distribute the signals. For signal transfer it is preferable to use capacitive coupling to join adjacent rungs to block dc currents and low frequency eddy currents and the values of capacitance must be selected such that the resonances of windows in the body coil are not close to the MR frequency when the body coil is in the de-tuned state.

Alternatively, if the point of minimum potential is at one end or other of the rung 22, then suitable coupling is provided to transfer the feed lines from the feed rung to other microwave elements between subsequent non-feed rungs. The point at which the potential is still below the maximum at which signals can be passed is dependent upon the breakdown voltage of air and the distance between the pads of the capacitors, which still maintains a good microwave path with less than 0.5 dB insertion loss.

Figure 8:
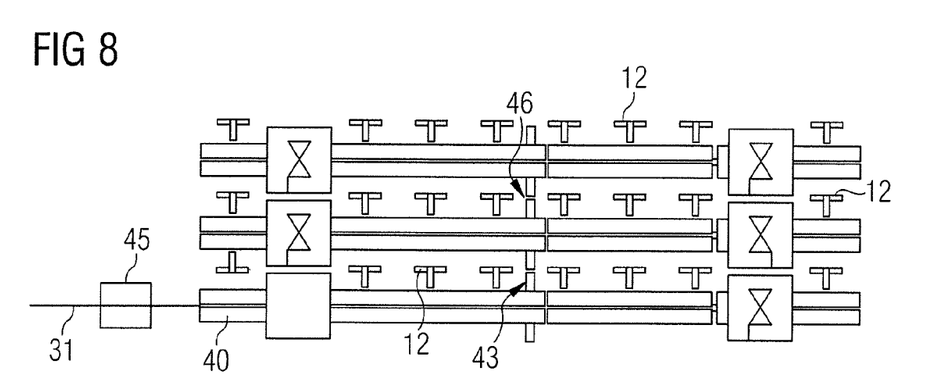
FIG. 8 illustrates a subset of the components of the antenna assembly of FIG. 7, in more detail.

In one example, the diode distribution ring is used as a ground plane to allow tracks 31 to pass across gaps 46 between birdcage antenna rungs 22. Thus, the microwave tracks are able to pass from any birdcage antenna rung 40, 41 to antenna elements 12 positioned between any other birdcage antenna rungs 22. One arrangement is illustrated in FIG. 8. The microwave tracks 31 and antenna feed 45 are connected to the first rung 22A. In this example, the region of minimum potential is around the distribution ring 43 positioned approximately at the center of the length of the body coil rungs. Microstrip or stripline tracks pass around this central ring to elements 12 which are not adjacent to the feed rung 40.

Preferably the microwave antenna feeds from any initial feed rung pass symmetrically or close to symmetrically around the bore such that the number of rung lengths of microwave antennas that are displaced in a clockwise direction from the initial feed rung is equal to the number of rung lengths of microwave antennas that are displaced in an anti clockwise direction from the initial feed rung, or the number may differ by one as necessary.

Although modifications and changes may be suggested by those skilled in the art, it is the intention of the inventors to embody within the patent warranted hereon all changes and modifications as reasonably and properly come within the scope of their contribution to the art.

We claim as our invention:

1. A wireless magnetic resonance imaging scanner antenna assembly comprising:
   a radio frequency (RF) antenna array comprising a plurality of RF antenna rungs; a microwave antenna array comprising a plurality of microwave antenna elements;
   a plurality of antenna feeds;
   said rungs and elements being grouped together in feed subsets, each subset comprising at least one feed rung, one non-feed rung and associated microwave antenna elements; and
   signal transfers between a feed rung and a non-feed rung of the subset being made at a point on the feed rung, within a region of minimum potential determined from the breakdown voltage of air and the distance between pads of capacitors required to maintain a good microwave path with less than 0.5 dB insertion loss.

2. An assembly according to claim 1, comprising a distribution ring is mounted within the region of minimum potential.

3. An assembly according to claim 1, wherein the region of minimum potential is substantially at the mid-point of the rung in the z direction of the bore tube.

4. An assembly according to claim 1, wherein the region of minimum potential is at one end of the antenna rung.

5. An assembly according to claim 1, wherein the RF antenna comprises an even number of antenna rungs.

6. An assembly according to claim 1, wherein each subset comprises 0.125 or greater the number of rungs in the RF antenna array.

7. An assembly according to claim 1, wherein each subset comprises 0.125 or greater the number of antenna elements in the microwave antenna array.

8. An assembly according to claim 1, wherein the number of feed rungs in the assembly comprises 0.125 of the total number of rungs in the RF antenna array.

9. An assembly according to claim 1, wherein the antenna rungs are printed on an outer surface of a bore tube spaced at equal intervals around the bore tube.

10. An assembly according to claim 1, wherein the antenna elements are mounted between adjacent rungs.

11. An assembly according to claim 1, comprising capacitive coupling between adjacent rungs that produces said signal transfer between adjacent rungs.

* * * * *